(12) United States Patent
Konagayoshi et al.

(10) Patent No.: US 10,883,680 B2
(45) Date of Patent: Jan. 5, 2021

(54) LIGHT-EMITTING MODULE AND METHOD OF MANUFACTURING LIGHT-EMITTING MODULE

(71) Applicant: NIKKISO CO., LTD., Tokyo (JP)

(72) Inventors: Hidenori Konagayoshi, Hakusan (JP); Nobuhiro Torii, Hakusan (JP); Tetsumi Ochi, Hakusan (JP); Hiroki Kiuchi, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 15/912,043

(22) Filed: Mar. 5, 2018

(65) Prior Publication Data

US 2018/0195677 A1    Jul. 12, 2018

Related U.S. Application Data

(63) Continuation of application No. PCT/JP2016/075012, filed on Aug. 26, 2016.

(30) Foreign Application Priority Data

Sep. 17, 2015 (JP) ................... 2015-184169

(51) Int. Cl.
*F21S 8/02* (2006.01)
*H01L 33/48* (2010.01)
(Continued)

(52) U.S. Cl.
CPC ............... *F21S 8/02* (2013.01); *F21V 15/01* (2013.01); *G02B 27/0955* (2013.01);
(Continued)

(58) Field of Classification Search
CPC ...................................................... F21S 8/02
See application file for complete search history.

(56) References Cited

U.S. PATENT DOCUMENTS

7,514,718 B2 * 4/2009 Shin ................. H01L 33/62
257/704
9,240,524 B2 * 1/2016 Park .................. H01L 33/486
(Continued)

FOREIGN PATENT DOCUMENTS

CN    1667436 A      9/2005
CN    100358151 C   12/2007
(Continued)

OTHER PUBLICATIONS

EPO, Search Report, dated Jan. 14, 2019, 8 pages.
(Continued)

*Primary Examiner* — Abul Kalam
(74) *Attorney, Agent, or Firm* — Muncy, Geissler, Olds & Lowe, PC (57) ABSTRACT

A light-emitting module includes: a package substrate that is provided with a recessed portion having an opening at an upper surface thereof; a light-emitting device that is housed in the recessed portion; a window member that is provided on the upper surface such that the window member covers the opening; and a sealing portion that bonds the package substrate and the window member. The window member includes a lens portion facing the light-emitting device and a flange portion that projects from the lens portion and bonds to the sealing portion. The lens portion and the flange portion are formed of the same glass material.

10 Claims, 6 Drawing Sheets

(51) Int. Cl.
*H01L 33/58* (2010.01)
*H01L 33/60* (2010.01)
*F21V 15/01* (2006.01)
*G02B 27/09* (2006.01)
*H01L 25/075* (2006.01)

(52) U.S. Cl.
CPC ............ *H01L 33/486* (2013.01); *H01L 33/58* (2013.01); *H01L 33/60* (2013.01); *H01L 25/0753* (2013.01)

(56) References Cited

U.S. PATENT DOCUMENTS

| | | | |
|---|---|---|---|
| 9,461,438 B2* | 10/2016 | Strauss | H05K 5/0091 |
| 9,768,362 B2* | 9/2017 | Park | H01L 33/486 |
| 2005/0201101 A1 | 9/2005 | Shimura | |
| 2005/0280014 A1 | 12/2005 | Park | |
| 2007/0205419 A1* | 9/2007 | Ono | H01L 33/58 |
| | | | 257/79 |
| 2007/0253188 A1 | 11/2007 | Klipstein et al. | |
| 2010/0237378 A1* | 9/2010 | Lin | H01L 33/486 |
| | | | 257/99 |
| 2013/0234274 A1* | 9/2013 | Kam | H01L 33/58 |
| | | | 257/432 |
| 2014/0284650 A1 | 9/2014 | Jung et al. | |
| 2015/0014711 A1* | 1/2015 | Bergenek | H01L 33/40 |
| | | | 257/88 |
| 2016/0036198 A1* | 2/2016 | Strauss | H01S 5/02244 |
| | | | 372/43.01 |
| 2016/0126426 A1* | 5/2016 | Kim | H01L 33/486 |
| | | | 257/98 |
| 2017/0112952 A1* | 4/2017 | Kato | A61L 2/10 |

FOREIGN PATENT DOCUMENTS

| | | |
|---|---|---|
| CN | 200990388 Y | 12/2007 |
| CN | 101302079 A | 11/2008 |
| CN | 202111088 U | 1/2012 |
| CN | 202695541 U | 1/2013 |
| CN | 204088315 U | 1/2015 |
| JP | S637674 A | 1/1988 |
| JP | 2002033519 A | 1/2002 |
| JP | 2005038956 A | 2/2005 |
| JP | 2005235864 A | 9/2005 |
| JP | 2007311423 A | 11/2007 |
| JP | 2013105140 A | 5/2013 |
| JP | 2014532986 A | 12/2014 |
| JP | 2016119477 A | 6/2016 |
| WO | WO2014/115202 A1 | 7/2014 |

OTHER PUBLICATIONS

Chinese Office Action issued for corresponding to Chinese Patent Application No. 201680050639.8 dated Jul. 29, 2019 and its English translation; pp. 1-18.
An Office Action in corresponding JP Application No. 2015-184169 dated Mar. 5, 2019, with English Translation is attached 6 pages.
Office Action issued in corresponding Chinese Patent Application No. 201680050639.8 dated Sep. 11, 2020.

* cited by examiner

LIGHT-EMITTING MODULE AND METHOD OF MANUFACTURING LIGHT-EMITTING MODULE

RELATED APPLICATION

Priority is claimed to Japanese Patent Application No. 2015-184169, filed on Sep. 17, 2015, the entire content of which is incorporated herein by reference.

BACKGROUND

1. Field of the Invention

The present invention relates to light-emitting modules that seal a light-emitting device therein and a method of manufacturing the light-emitting modules.

2. Description of the Related Art

Light-emitting diodes (LED) are used for various purposes such as illumination, signals, and optical communication mainly as light sources for a wavelength range from visible light to infrared light. In general, LED devices are sealed by a light transmissive material for packaging in order to protect light-emitting devices made of compound semiconductors from the external environment.

A method of the sealing includes a method of coating, with a resin material, light-emitting devices attached to lead electrodes and a method of housing light-emitting devices in a package body provided with an opening and covering the opening with a window member such as a glass plate. The latter method includes a technique of providing a metal frame at the opening of the package body and bonding the metal frame and the glass plate using a low melting point glass. A ball lens for collimating an outgoing beam is sometimes bonded instead of a glass plate.

In the above-described encapsulating method, since a package body and a ball lens are bonded via a metal frame, the number of parts is increased by the number of metal frames to be prepared, and the number of bonding sites is also increased. While keeping high sealing properties, the package body and the ball lens are desirably bonded with a simpler structure.

SUMMARY OF THE INVENTION

In this background, a purpose of the present invention is to provide a highly-reliable light-emitting module integrated with a lens feature.

A light-emitting module according to one embodiment of the present invention includes a package substrate that is provided with a recessed portion having an opening at an upper surface thereof; a light-emitting device that is housed in the recessed portion; a window member that is provided on the upper surface such that the window member covers the opening; and a sealing portion that bonds the package substrate and the window member. The window member includes a lens portion facing the light-emitting device and a flange portion that projects from the lens portion and bonds to the sealing portion. The lens portion and the flange portion are formed of the same glass material.

According to this embodiment, the lens portion and the flange portion are formed in an integral manner, and the flange portion allows for bonding to the package substrate. Thus, the sealing properties between the package substrate and the window member can be improved. Further, since the window member having a lens feature and the package substrate can be directly bonded, the number of bonding sites can be reduced compared to a case where the window member and the package substrate are bonded via another member. Thereby, even when the window member having a lens feature is bonded, the number of bonding sites, which are causes for the deterioration of sealing properties, can be reduced, and the reliability of the light-emitting module can be increased.

The lens portion and the flange portion may be formed of a quartz glass.

The light-emitting device may emit ultraviolet light whose wavelength is included in the band of a wavelength of 200 nm to 360 nm.

The lens portion may convert light from the light-emitting device into parallel light and emit the parallel light to the outside.

The lens portion may be a sphere or a portion of a sphere.

The lens portion may be a Fresnel lens.

Another embodiment of the present invention relates to a method of manufacturing a light-emitting module. This method includes: injection-molding a window member including a lens portion and a flange portion projecting from the lens portion, using fused quartz as a material; housing a light-emitting device in a recessed portion of a package substrate that is provided with the recessed portion having an opening at an upper surface thereof; arranging the window member at the upper surface such that the lens portion and the light-emitting device face each other; and bonding the package substrate and the flange portion using a sealing material.

According to this embodiment, since a window member having a lens portion and a flange portion can be formed in an integral manner by injection molding, the manufacturing cost for a light-emitting module can be lowered compared to a case where a base material of a quartz glass is cut and polished to form a window member.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Described below is an explanation of the embodiments of the present invention with reference to figures. In the figures, like numerals represent like constituting elements, and the description thereof is omitted appropriately.

Described below is an explanation of the embodiments of the present invention with reference to figures. In the figures, like numerals represent like constituting elements, and the description thereof is omitted appropriately.

Figure 1:
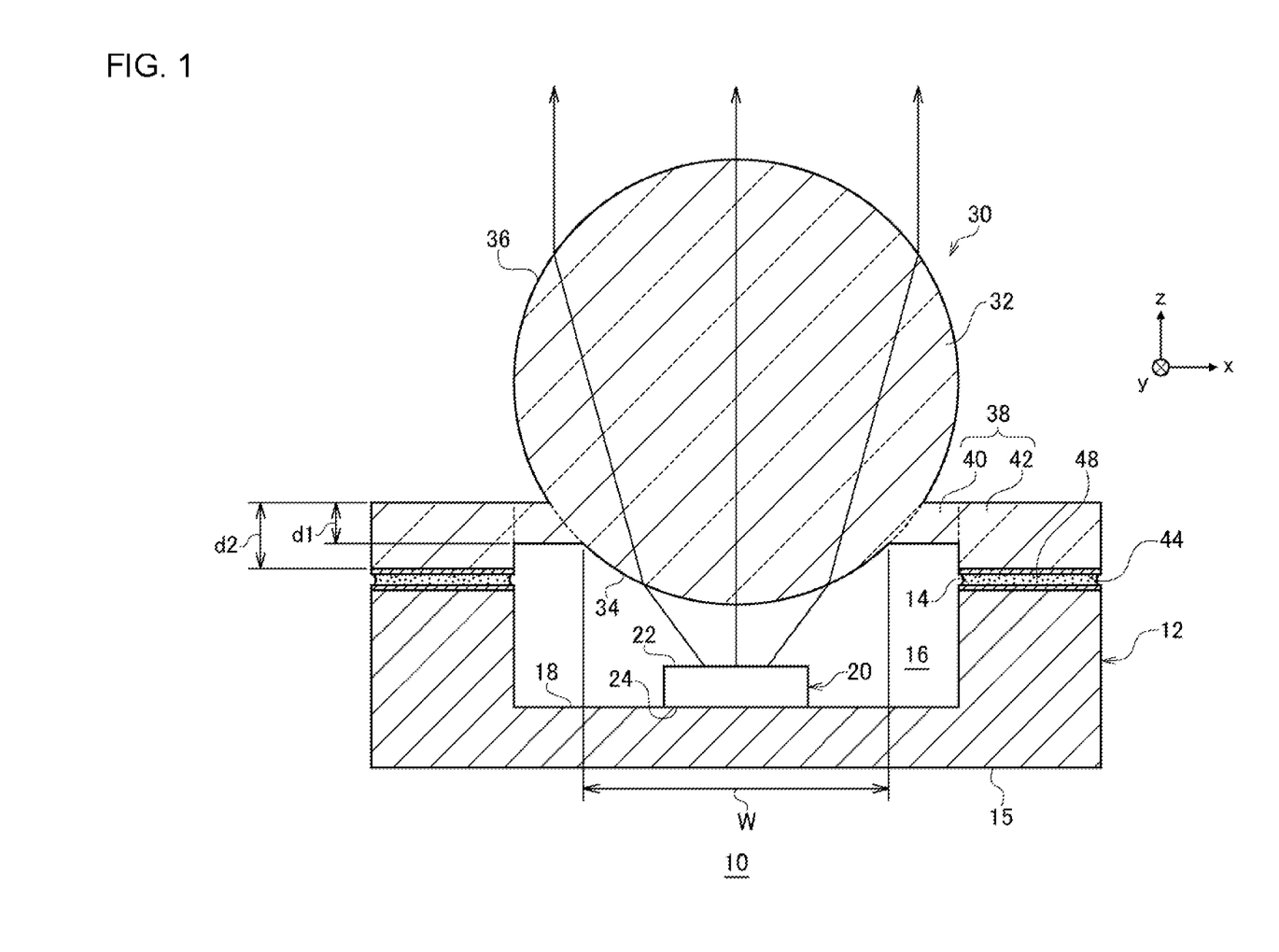
FIG. 1 is a sectional view illustrating a light-emitting module according to an embodiment.
Figure 2:
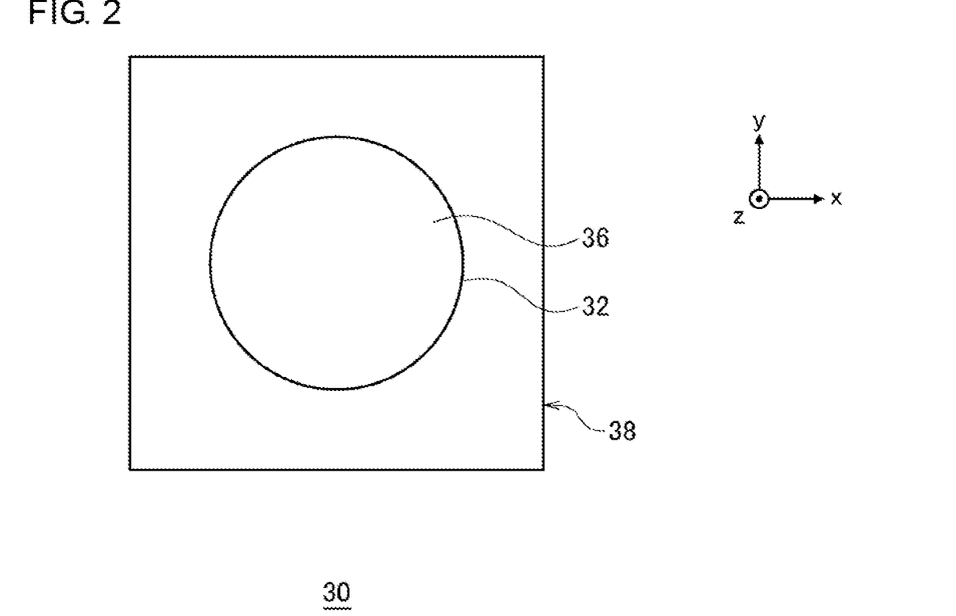
FIG. 2 is a top view illustrating the structure of a window member of FIG. 1.
Figure 3:
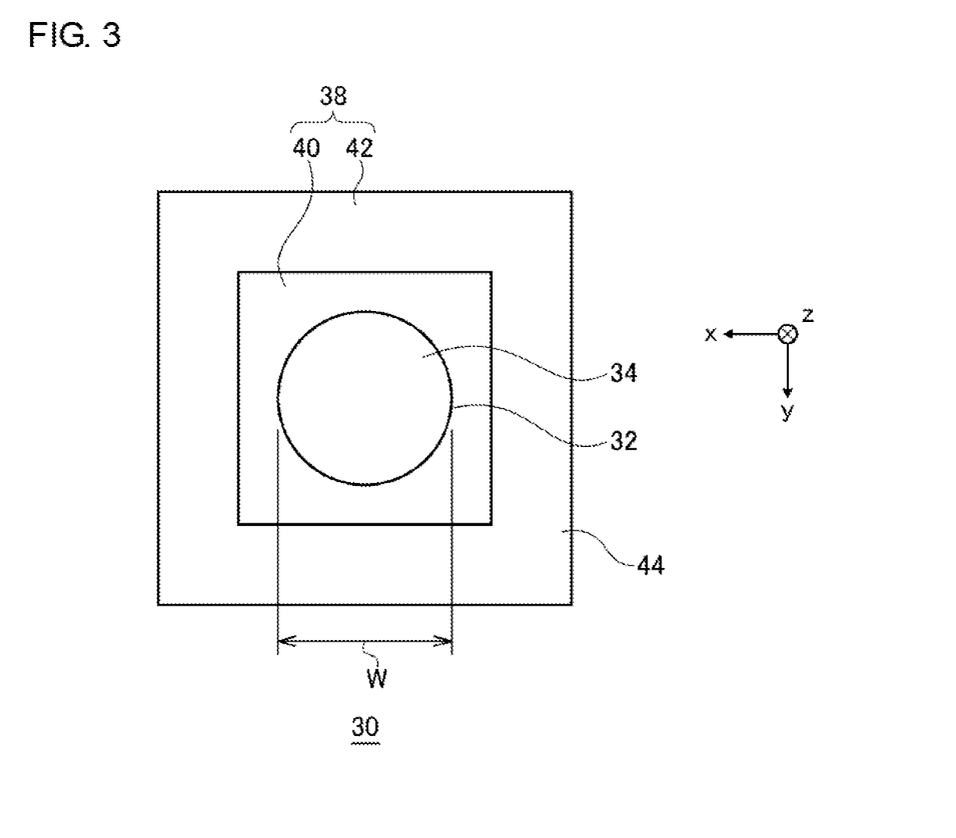
FIG. 3 is a bottom view illustrating the structure of the window member of FIG. 1.

FIG. 1 is a sectional view illustrating a light-emitting module 10 according to an embodiment. FIG. 2 is a top view illustrating the structure of a window member 30 of FIG. 1, and FIG. 3 is a bottom view thereof. The light-emitting module 10 is provided with a package substrate 12, a light-emitting device 20, a window member 30, and a sealing portion 48.

In the explanation of the present specification, the direction of travel of light that is output from the light-emitting module 10 is set to be a z direction, and directions that are perpendicular to the z direction are set to be an x direction and a y direction. The z direction is sometimes referred to as a longitudinal direction or a vertical direction, and the x direction and the y direction are each sometimes referred to as a transverse direction or a horizontal direction.

The package substrate 12 is a plate-like member having an upper surface 14 and a lower surface 15 and is provided with a recessed portion 16 having an opening at the upper surface 14. The package substrate 12 is a ceramic substrate containing alumina ($Al_2O_3$), aluminum nitride (AlN), and the like and is a so-called high temperature co-fired ceramic (HTCC) multilayer substrate.

The upper surface 14 is rectangular shaped, and, in the central part thereof, the recessed portion 16 forming a rectangular opening is provided. Metallization treatment is performed on a region of the upper surface 14 in which the recessed portion 16 is not provided. The upper surface 14 is formed by plating a substrate containing tungsten (W), molybdenum (Mo), etc., with nickel (Ni), gold (Au), or the like. To the upper surface 14, the window member 30 is bonded via the sealing portion 48.

The lower surface 15 is rectangular shaped, and an external electrode (not shown) that is connected to the anode or cathode of the light-emitting device 20 is provided. The recessed portion 16 is open at the upper surface 14 and houses the light-emitting device 20 inside the recessed portion 16. The light-emitting device 20 is mounted on a bottom surface 18 of the recessed portion 16.

The light-emitting device 20 is an LED formed of a compound semiconductor, is housed in the recessed portion 16, and radiates light to the outside of the light-emitting module 10 through the window member 30. In the present embodiment, as the light-emitting device 20, an ultraviolet light LED is used whose center wavelength or peak wavelength is included in an ultraviolet region of about 200 nm to 360 nm. For example, an ultraviolet light LED is used that emits ultraviolet light of around 260 nm, which is a wavelength for high sterilization efficiency. As such an ultraviolet light LED, for example, those in which aluminum gallium nitride (AlGaN) is used are known.

The light-emitting device 20 has a light-emitting surface 22 and a mounting surface 24 opposite to the light-emitting surface 22. The light-emitting device 20 is arranged such that the mounting surface 24 is in contact with the bottom surface 18. This allows heat radiated by the light-emitting device 20 to be dissipated to the outside via the package substrate 12.

The window member 30 includes a lens portion 32 and a flange portion 38 and is provided on the upper surface 14 such that the window member 30 covers the opening of the recessed portion 16. The window member 30 is provided at a position where the lens portion 32 faces the light-emitting device 20 and where a bonding surface 44 of the flange portion 38 faces the upper surface 14. The window member 30 is formed of a material that transmits ultraviolet light emitted by the light-emitting device 20 and is formed of, for example, a quartz ($SiO_2$) glass.

The lens portion 32 is formed into a sphere and functions as a ball lens. The lens portion 32 has a light incident surface 34, which faces the light-emitting surface 22 of the light-emitting device 20 and on which light from the light-emitting device 20 becomes incident, and a light emission surface 36, which becomes exposed on the outside of the light-emitting module 10 and which emits light from the light-emitting device 20. The light incident surface 34 and the light emission surface 36 are each formed as a spherical surface. The lens portion 32 is arranged such that the light-emitting device 20 is located at the focal point of the lens portion 32 and such that the light incident surface 34 becomes close to the light-emitting device 20. Thus, the lens portion 32 has a collimating function of converting light from the light-emitting device 20 into parallel light and emitting the parallel light.

The flange unit 38 is a plate-like member that projects in the transverse direction from the lens portion 32 and has an outer circumference in a rectangular shape that corresponds to the package substrate 12. The flange portion 38 has a bonding portion 42 facing the upper surface 14 of the package substrate 12 and a connecting portion 40 connecting the lens portion 32 and the bonding portion 42. The flange portion 38 is formed integrally with the lens portion 32 and is formed of the same glass material.

The bonding portion 42 is a part where the bonding surface 44 on which metallization treatment has been performed is formed. The bonding surface 44 is formed by a method such as vacuum deposition, sputtering, or the like and is formed of a multilayer film where, for example, titanium (Ti), copper (Cu), nickel (Ni), and gold (Au) are stacked in order on the bonding portion 42 formed of a quartz glass. Alternatively, chromium (Cr) may be used instead of titanium.

The connecting portion 40 is a part where metallization treatment is not performed and is a part where the thickness d1 thereof in the z direction is smaller than the thickness d2 of the bonding portion 42. The connecting portion 40 is also considered to be a part where a difference in level is provided away from the upper surface 14 of the package substrate 12. Providing the difference in level on the connecting portion 40 allows the range W of the light incident surface 34, which is a spherical surface, to be increased. Increasing the range W of the light incident surface 34 allows more light output from the light-emitting device 20 to be incident on the light incident surface 34 and allows the amount of light collimated by the lens portion 32 and emitted from the light emission surface 36 to be increased.

The sealing portion 48 is a sealing material that is provided between the package substrate 12 and the window member 30 and fills a space between the package substrate 12 and the window member 30. The sealing portion 48 is formed of a low melting point metal material and contains, for example, a gold-tin (AuSn) or silver-tin (AgSn) alloy. The sealing portion 48 spreads between the upper surface 14 and the bonding surface 44 in a molten state and forms an eutectic bond with the upper surface 14 and the bonding surface 44. Thereby, the sealing portion 48 seals the space between the package substrate 12 and the window member 30. At the time of the sealing, the inside of the recessed portion 16 is filled with an inert gas such as nitrogen ($N_2$) or the like.

The above configuration allows the light-emitting module 10 to encapsulate the light-emitting device 20, which is an ultraviolet light LED, inside the light-emitting module 10 and to output ultraviolet light to the outside via the window member 30. Light from the light-emitting device 20 is collected by the lens portion 32 and converted into parallel light or light that is in a condition of being similar to parallel light so as to be emitted. Since a quartz glass is used as the window member 30, even when the light-emitting device 20 that emits ultraviolet light of a wavelength of 360 nm or less is used, the ultraviolet light can be efficiently taken outside.

Figure 4:
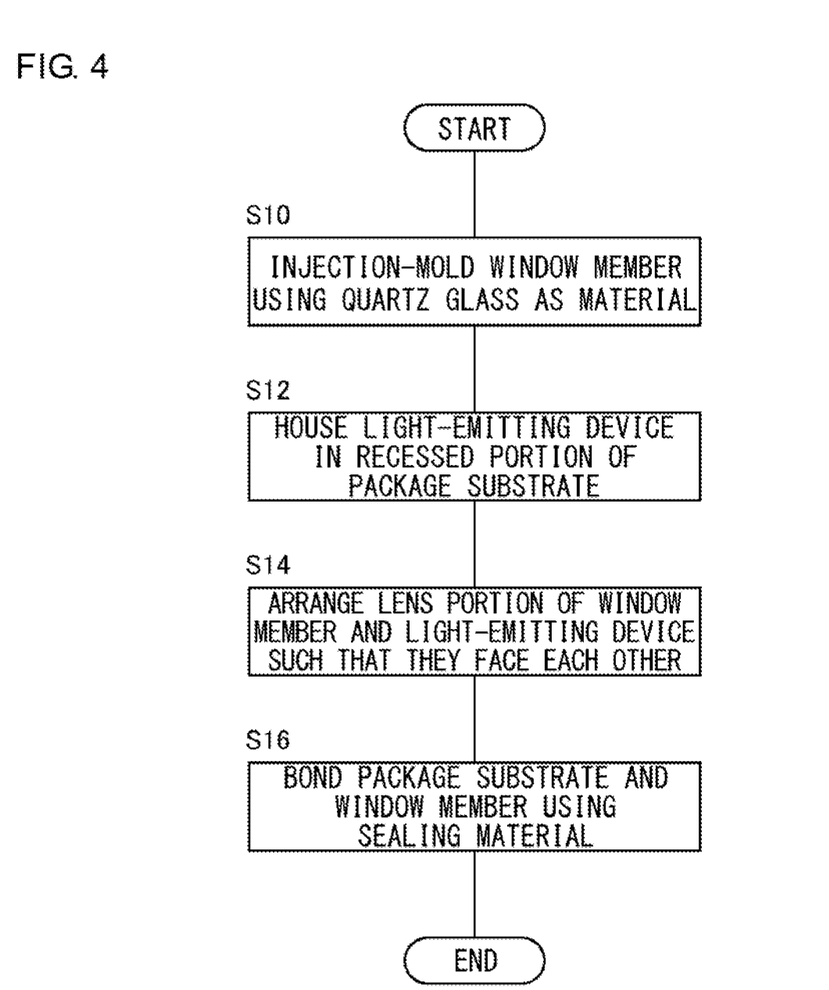
FIG. 4 is a flowchart illustrating a method of manufacturing a light-emitting module.

An explanation will be given now regarding a method of manufacturing the light-emitting module 10. FIG. 4 is a flowchart illustrating the method of manufacturing the light-emitting module 10. The window member 30 is injection molded using a quartz glass as a material (S10), and the light-emitting device 20 is housed in the recessed portion 16 of the package substrate 12 (S12). Then, the window member 30 is arranged over the recessed portion 16 such that the lens portion 32 of the window member 30 faces the light-emitting device 20 (S14), and the upper surface 14 of the package substrate 12 and the bonding surface 44 of the window member 30 are bonded using the sealing material (S16).

In the injection molding process of S12, the window member 30 is molded by preparing a metallic mold corresponding to the shape of the window member 30 including the lens portion 32 and the flange portion 38 and then pouring fused quartz made of quartz glass pellets or the like. After the quartz that has been molded is removed from the metallic mold, residual heat of the quartz is removed, and the surface is polished; thereby, the quartz is processed into the window member 30 made of a transparent quartz glass. Metallization treatment is performed on the bonding surface 44 of the window member 30 that has been polished after the injection molding. In the sealing process of S16, the package substrate 12 and the window member 30 are bonded in a state where the recessed portion 16 of the package substrate 12 is filled with an inert gas such as nitrogen ($N_2$) or the like.

Shown below are advantageous effects achieved by the light-emitting module 10 according to the present embodiment.

According to the present embodiment, the lens portion 32 and the flange portion 38 are formed in an integral manner, and the flange portion 38 allows for bonding to the package substrate 12. Thus, the sealing properties between the package substrate 12 and the window member 30 can be improved. Further, since the window member 30 having a lens feature and the package substrate 12 can be directly bonded, the number of bonding sites can be reduced compared to a case where the window member 30 and the package substrate 12 are bonded via another member. Thereby, even when the light-emitting module 10 is to be provided with a lens feature, the number of bonding sites, which are causes for the deterioration of sealing properties, can be reduced, and the reliability of the light-emitting module 10 can be increased.

According to the present embodiment, since the window member 30 is formed of a quartz glass, even when the light-emitting device 20 that emits ultraviolet light of a wavelength of 360 nm or less is used, the ultraviolet light transmittance of the window member 30 can be increased. Further, since the window member 30 is provided with a lens feature, ultraviolet light from the light-emitting device 20 can be efficiently taken out outside. This allows the ultraviolet light output intensity of the light-emitting module 10 to be increased.

In the present embodiment, since a structure is employed where no metal frame is provided for the bonding of the package substrate 12 and the window member 30, the distance between the light-emitting device 20 and the light incident surface 34 of the lens portion 32 can be reduced compared to a case where a metal frame is inserted between the package substrate 12 and the window member 30. This allows for an increase in the efficiency for taking out ultraviolet light by coupling more ultraviolet light emitted by the light-emitting device 20 at the lens portion 32.

According to the present embodiment, since the bonding to the package substrate 12 is realized using the flange portion 38 having the flat bonding surface 44, a package substrate designed for the bonding to a flat glass plate can be directly used. In other words, without changing the design of the package substrate 12 in order to be bonded to the window member 30 having a lens feature, the window member 30 can be bonded to the package substrate 12. Since it is not necessary to newly design or manufacture a package substrate, the cost for the light-emitting module 10 can be lowered.

According to the present embodiment, since the window member 30 having a lens feature can be manufactured by injection molding using a quartz glass, the manufacturing cost can be lowered compared to a case where a base material of a quartz glass is cut and polished for processing. Therefore, a light-emitting module 10 with high sealing properties and reliability and with high output intensity can be realized at a reduced cost.

In the present embodiment, instead of a low melting point glass, the sealing portion 48 formed of a metal material is used for the bonding of the package substrate 12 and the window member 30. In general, the wettability of a quartz used as the window member 30 to a low melting point glass is not preferable, and the reliability for sealing may be thus lowered when a low melting point glass is used as the sealing portion. On the other hand, in the present embodiment, since the window member 30 on which metallization treatment has been performed is sealed using a metal material with high wettability, the reliability for sealing can be increased.

In the present embodiment, as the sealing portion 48, a metal that is a material softer than the package substrate 12 and the window member 30 is used. This allows, even when stress is applied due to a difference in the thermal expansion coefficients of respective materials used for the package substrate 12 and the window member 30, the sealing portion 48 to function as a buffer layer that reduces the stress. Thereby, compared to a case where a low melting point glass, which is a relatively hard material, is used as the sealing portion 48, the stress-reducing effect can be improved, and the reliability for sealing can be increased.

(First exemplary variation)

Figure 5:
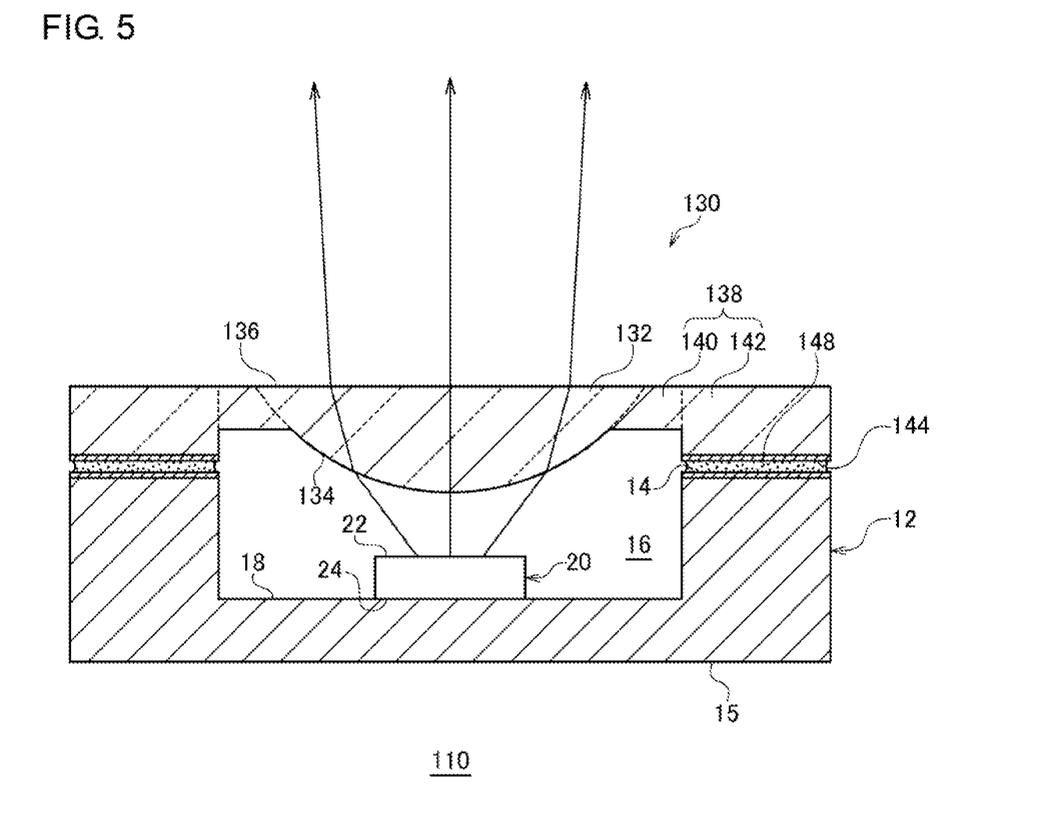
FIG. 5 is a sectional view illustrating a light-emitting module according to an exemplary variation.

FIG. 5 is a sectional view illustrating a light-emitting module 110 according to an exemplary variation. The light-emitting module 110 is different from the above-described embodiment in that a lens portion 132 of a window member 130 has, instead of a spherical shape, a shape that looks like a sphere that has a portion that has been cut off. A description will be given in the following mainly regarding differences from the above-described embodiment.

The window member 130 includes a lens portion 132 and a flange portion 138, and the flange portion 138 has a connecting portion 140 and a bonding portion 142. The bonding portion 142 is provided with a bonding surface 144 for bonding to an upper surface 14 of a package substrate 12. The lens portion 132 has a light incident surface 134 formed by a spherical surface and a light emission surface 136 formed by a flat surface. Therefore, the lens portion 132 does not project above the flange portion 138 and forms a flat exposed surface along with the flange portion 138. Therefore, according to the present exemplary variation, since the light emission surface 136 of the lens portion 132 is formed by a flat surface, the thickness of the light-emitting module 110 in the vertical direction can be made smaller than that of the above-described embodiment, and the light-emitting module 110 can be miniaturized.

(Second exemplary variation)

Figure 6:
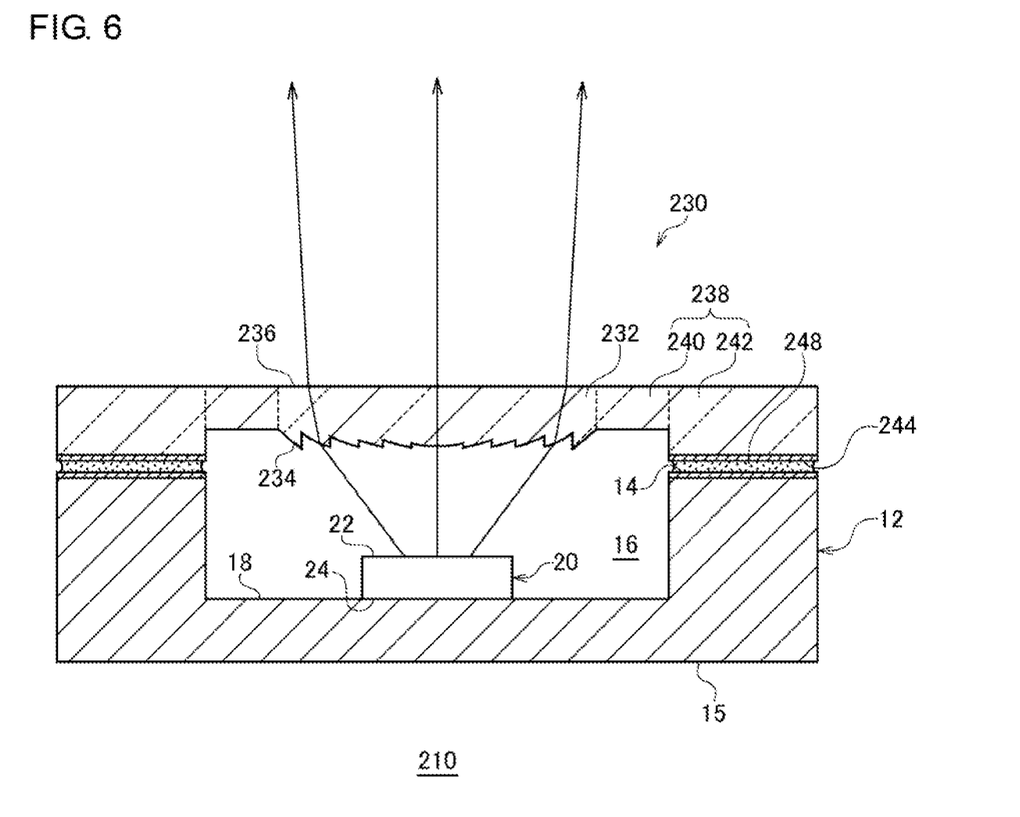
FIG. 6 is a sectional view illustrating a light-emitting module according to an exemplary variation.

FIG. 6 is a sectional view illustrating a light-emitting module 210 according to an exemplary variation. The light-emitting module 210 is different from the above-described first exemplary variation in that a light incident surface 234 of a window member 230 is formed by a Fresnel surface. A description will be given in the following mainly regarding differences from the first exemplary variation.

The window member 230 includes a lens portion 232 and a flange portion 238, and the flange portion 238 has a connecting portion 240 and a bonding portion 242. The bonding portion 242 is provided with a bonding surface 244 for bonding to an upper surface 14 of a package substrate 12. The lens portion 232 is a so-called Fresnel lens and has a light incident surface 234 formed by a Fresnel surface and a light emission surface 236 formed by a flat surface. According to the present exemplary variation, since the thickness in the vertical direction is smaller than that of the lens portion 132 according to the above-described exemplary variation, the lens portion 232 can be arranged closer to a light-emitting device 20, and light from the light-emitting device 20 can be output to the outside more efficiently.

(Third exemplary variation)

Figure 7:
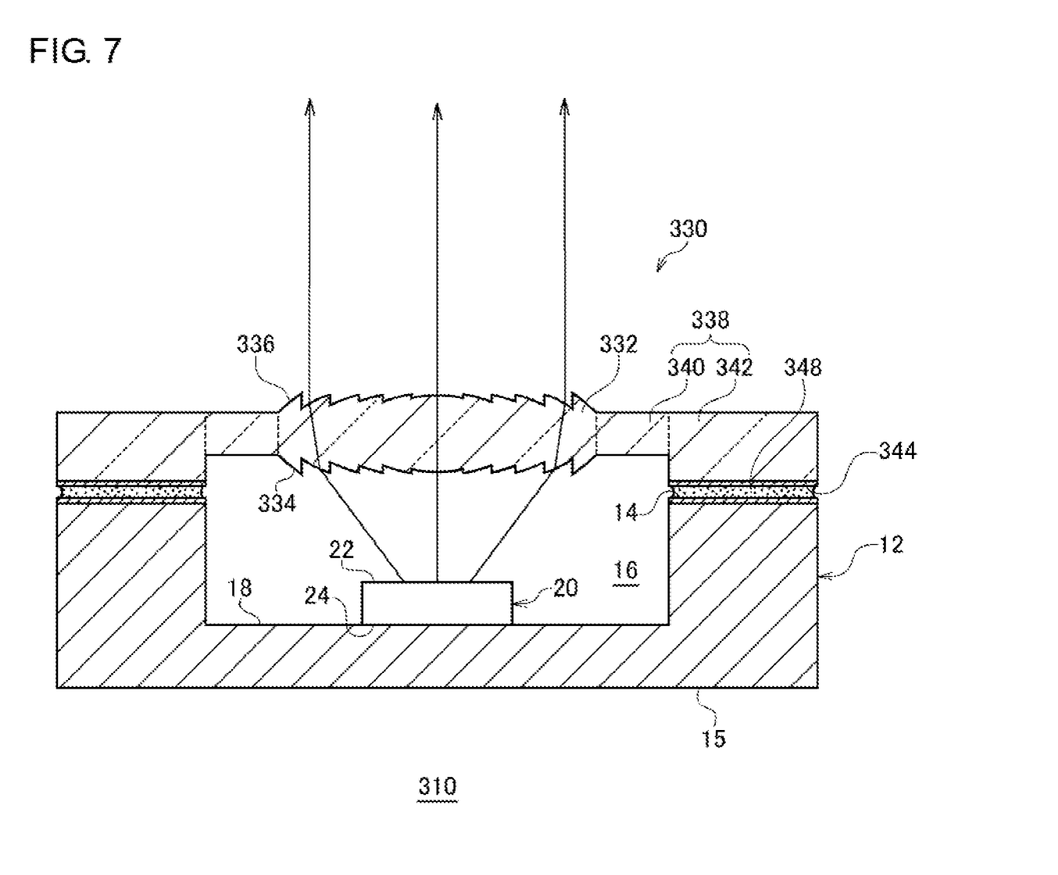
FIG. 7 is a sectional view illustrating a light-emitting module according to an exemplary variation.

FIG. 7 is a sectional view illustrating a light-emitting module 310 according to an exemplary variation. The light-emitting module 310 is different from the above-described embodiment in that both a light incident surface 334 and a light emission surface 336 of a window member 330 are formed by Fresnel surfaces. A description will be given in the following mainly regarding differences from the embodiment.

The window member 330 includes a lens portion 332 and a flange portion 338, and the flange portion 338 has a connecting portion 340 and a bonding portion 342. The bonding portion 342 is provided with a bonding surface 344 for bonding to an upper surface 14 of a package substrate 12. The lens portion 332 is a so-called Fresnel lens, and both the light incident surface 234 and the light emission surface 236 are formed by Fresnel surfaces.

According to the present exemplary variation, since the thickness in the vertical direction can be made smaller than that of the lens portion 32 according to the above-described embodiment, the light-emitting module 310 can be miniaturized. Further, since the lens portion 232 can be arranged closer to a light-emitting device 20, light from the light-emitting device 20 can be output to the outside more efficiently.

These embodiments are intended to be illustrative only, and it will be obvious to those skilled in the art that various modifications could be developed based on the knowledge of a skilled person and that such modifications are also within the scope of the present invention.

In the above stated embodiment and exemplary variations, a case is shown where those that emit ultraviolet light are used as light-emitting devices. Alternatively, a light-emitting device that emits visible light and/or infrared light may be used.

In the above stated embodiment and exemplary variations, a case is shown where a quartz glass is used as the material of a window member. However, the material of a window member is not limited to this. An optical glass, such as BK7, other than a quartz may be used. Alternatively, a resin material such as a transparent plastic may be used as a window member.

In the above stated embodiment and exemplary variations, a case is shown where a high temperature co-fired ceramic (HTCC) multilayer substrate is used as a package substrate. Alternatively, a low temperature co-fired ceramic (LTCC) multilayer substrate including silica ($SiO_2$), calcium oxide (CaO), boron oxide ($B_2O_3$), etc., may be used as a ceramic material. In this case, as metallization treatment performed on an upper surface 14, a material having a relatively low melting point such as copper, silver, or the like may be used instead of a high melting point material such as tungsten, molybdenum, or the like.

It should be understood that the invention is not limited to the above-described embodiment, but may be modified into various forms on the basis of the spirit of the invention. Additionally, the modifications are included in the scope of the invention.

The invention claimed is:

1. A light-emitting module comprising:
a package substrate that is provided with a recessed portion having an opening at an upper surface thereof;
a light-emitting device that is housed in the recessed portion;
a window member that is provided on the upper surface such that the window member covers the opening; and
a sealing portion that bonds the package substrate and the window member,
wherein the window member includes a lens portion and a flange portion,
wherein the lens portion is formed of glass material and faces the light-emitting device,
wherein the flange portion is formed of the glass material and projects from the lens portion,
wherein the flange portion has a bonding portion and a connecting portion,
wherein the bonding portion faces the upper surface of the package substrate and is bonded to the sealing portion,
wherein the connecting portion connects the lens portion and the bonding portion away from the upper surface of the package substrate,
wherein the thickness of the connecting portion in a direction perpendicular to the projecting direction of the flange portion being smaller than the thickness of the bonding portion.

2. The light-emitting module according to claim 1, wherein the lens portion and the flange portion are formed of a quartz glass.

3. The light-emitting module according to claim 2, wherein the light-emitting device emits ultraviolet light whose wavelength is included in the band of a wavelength of 200 nm to 360 nm.

4. The light-emitting module according to claim 1, wherein the lens portion converts light from the light-emitting device into parallel light and emits the parallel light to the outside.

5. The light-emitting module according to claim 1, wherein the lens portion is a sphere or a portion of a sphere.

6. The light-emitting module according to claim 1, wherein the lens portion is a Fresnel lens.

7. The light-emitting module according to claim 1, wherein the lens portion is a sphere, and the center of the sphere is located outside the flange portion.

8. The light-emitting module according to claim 1,
wherein the bonding portion has a bonding surface that faces the upper surface, and a film stack of titanium (Ti), copper (Cu), nickel (Ni), and gold (Au) or a film stack of chromium (Cr), Cu, Ni, and Au is formed on the bonding surface, and
wherein the sealing portion contains a gold-tin (AuSn) or silver-tin (AgSn) alloy and forms an eutectic bond with the bonding surface.

9. The light-emitting module according to claim 8,
wherein a metallization treatment for bonding to the sealing portion is not performed in the connecting portion.

10. A method of manufacturing the light-emitting module according to claim 1, comprising:
injection-molding, using fused quartz as a material, the window member that includes the lens portion and the flange portion, wherein the flange portion has the bonding portion and the connecting portion;
housing the light-emitting device in the recessed portion of the package substrate;
arranging the window member at the upper surface of the package substrate such that the lens portion and the light-emitting device face each other; and
bonding the package substrate and the bonding portion using a sealing material.

* * * * *